United States Patent

Prancz

[11] Patent Number: 5,969,415
[45] Date of Patent: Oct. 19, 1999

[54] DATA CARRIER WITH A COMPONENT-CONTAINING MODULE AND WITH A COIL, METHOD OF PRODUCING SUCH A DATA CARRIER AND MODULE THEREFOR

[75] Inventor: Markus Prancz, Vienna, Austria

[73] Assignee: Austria Card Plastikkarten, Vienna, Austria

[21] Appl. No.: 09/011,120

[22] PCT Filed: Jul. 15, 1996

[86] PCT No.: PCT/IB96/00694

§ 371 Date: Jan. 29, 1998

§ 102(e) Date: Jan. 29, 1998

[87] PCT Pub. No.: WO97/05571

PCT Pub. Date: Feb. 13, 1997

[30] Foreign Application Priority Data

Aug. 1, 1995 [AT] Austria .................. 422/95 U

[51] Int. Cl.⁶ .................................................. H01L 23/02
[52] U.S. Cl. ........................ 257/679; 257/678; 257/786; 438/106; 438/125
[58] Field of Search .................. 257/679, 678, 257/700, 786; 438/106, 125, 126, 108; 235/487, 380, 492

[56] References Cited

U.S. PATENT DOCUMENTS

| | | |
|---|---|---|
| 4,962,415 | 10/1990 | Yamamoto et al. ............... 257/679 |
| 5,067,008 | 11/1991 | Yanaka et al. .................... 257/679 |
| 5,401,688 | 3/1995 | Yamaji et al. . |
| 5,598,032 | 1/1997 | Fidallgo .......................... 257/679 |
| 5,637,858 | 6/1997 | Hoppe et al. .................... 257/679 |
| 5,640,306 | 6/1997 | Gaumet et al. .................. 257/679 |
| 5,773,880 | 6/1998 | Ohno ............................. 257/679 |
| 5,809,633 | 9/1998 | Mundigl et al. . |

FOREIGN PATENT DOCUMENTS

0671705A2  9/1995  European Pat. Off. .
0682321A2  11/1995  European Pat. Off. .

*Primary Examiner*—Mahshid Saadat
*Assistant Examiner*—S. V. Clark

[57] ABSTRACT

In a data carrier (46) with a data carrier body (14), a component (31) and a coil (2) are incorporated in the data carrier body (14) and the component (31) is disposed in a component level zone (Z2) of the data carrier body (14) and the coil turns (3) of the coil (2), at least in their area adjacent the component (31), are disposed in a winding level zone (Z1) situated outside the component level zone (Z2), and two module connecting contacts (32, 33) extend through the component level zone (Z2) up to the coil connecting contacts (4, 5).

16 Claims, 3 Drawing Sheets

DATA CARRIER WITH A COMPONENT-CONTAINING MODULE AND WITH A COIL, METHOD OF PRODUCING SUCH A DATA CARRIER AND MODULE THEREFOR

BACKGROUND OF THE INVENTION

The invention relates to a data carrier comprising a data carrier body bounded by a body surface and incorporating a module and a coil, which coil is separate from the module and has coil turns and at least two coil connecting contacts, the module comprising a plate-shaped carrier, which extends substantially parallel to said body surface and which is bounded by a first carrier main surface facing said body surface and by a second carrier main surface substantially parallel to the first carrier main surface, and at least one component, which component is incorporated in the data carrier body, is connected to the carrier, is raised with respect to the second carrier main surface, and is disposed in a component level zone which extends transversely to said body surface, and at least two module connecting contacts connected to the carrier and arranged in the area of the second carrier main surface, and the coil turns of the coil, at least in their area adjacent the component, being disposed in a winding level zone which is situated outside the component level zone and which extends transversely to said body surface, the coil connecting contacts together with the coil turns being disposed in the winding level zone, and each coil connecting contact being disposed opposite a module connecting contact in a direction transverse to the second carrier main surface and being connected to the last-mentioned connecting contact in an electrically conductive manner, and the module connecting contacts projecting beyond the level of the component and extending through the component level zone up to the coil connecting contacts, which are disposed in the winding level zone, and the data carrier having a recess which terminates in said body surface and which accommodates the module.

The invention further relates to a method of manufacturing a data carrier, in which a data carrier body is manufactured, which data carrier body is bounded by a body surface and in which during the manufacture of the data carrier body a coil having coil turns and at least two coil connecting contacts is incorporated in the data carrier body, which coil turns, at least in their area adjacent a component after the method has been completed, are arranged in a winding level zone which is situated outside a component level zone of the component and extends transversely to said body surface, and the coil connecting contacts together with the coil turns are arranged in the winding level zone, and in which a module is incorporated in the data carrier body, which module comprises a plate-shaped carrier, which is bounded by a first carrier main surface and by a second carrier main surface substantially parallel to the first carrier main surface, and the component, which is connected to the carrier and is raised with respect to the second carrier main surface, and at least two module connecting contacts connected to the carrier and arranged in the area of the second carrier main surface, the first carrier main surface then facing said body surface and the second carrier main surface being remote from said body surface and the component then being disposed in its component level zone which extends transversely to said body surface, and each module connecting contact and each coil connecting contact then being disposed opposite one another in a direction transverse to the second carrier main surface and being connected in an electrically conductive manner, and in which for incorporation in the data carrier body a module is used whose module connecting contacts project beyond the level of the component of the module, and the module connecting contacts are passed through the component level zone up to the coil connecting contacts, which are disposed in the winding level zone, and are connected to the coil connecting contacts so as to form an electrically conductive connection, and in which a recess which terminates in said body surface is formed in the data carrier body.

Such a data carrier of the type defined in the first paragraph and constructed as a chip card, a method of the type defined in the second paragraph are known from, for example, the document EP 0 671 705 A2.

FIGS. 5 and 7 in the document EP 0 671 705 A2 each disclose a chip card whose data carrier body comprises a base foil, which carries the coil, and a plastic cover body which is connected to the base foil in an injection-molding process and in which the recess for accommodating the module is formed by taking appropriate steps during the injection-molding process for the formation of the plastic cover body. By said steps during the injection-molding process it is achieved that directly after the injection-molding operation, i.e. directly after the data carrier body with the recess has been obtained, the coil connecting contacts are freely accessible at least with a substantial part of their contact faces intended for electrical connection to the module connecting contacts and can consequently be connected to the module connecting contacts without any additional measures directly after the data carrier body has been obtained, if applicable, with the aid of electrically conductive connecting means to be introduced additionally. Chip cards whose data carrier bodies comprise a base foil and a plastic cover body have various drawbacks, for example, they tend to warp or bend, are comparatively intricate to manufacture and are not suitable for some uses, so that their field of use is limited.

SUMMARY OF THE INVENTION

It is an object of the invention to preclude the aforementioned limitations in a data carrier of the type defined in the first paragraph and to provide an improved data carrier. According to the invention this object is achieved for a data carrier of the type defined in the first paragraph in that the data carrier body has been manufactured from at least two foils by means of a lamination process, and there has been provided a recess formed by means of a material removal process, and in a bottom area of the recess, which bottom area is remote from said body surface, at least two passages, which extend from the bottom area of the recess up to the coil connecting contacts, have been formed, preferably also by means of the same material removal process, through which passages the module connecting contacts are connected to the coil connecting contacts in an electrically conductive manner. Such an embodiment has proved to be very advantageous in view of a low-cost production. Moreover, it provides a data carrier having a data carrier body which is produced in a lamination process and in which a recess for accommodating a module is formed by a material removal process, two passages to the coil connecting contacts being also formed in the bottom area of this recess by means of a material removal process, preferably the same material removal process, which yields the important advantage that the passages which begin in the bottom area have only a small depth, as a result of which only a short material removal operation is necessary to form them and always a reliable electrically conductive connection between the module connecting contacts and the coil connecting contacts can be achieved and guaranteed.

In a data carrier in accordance with the invention as defined above it has proved to be very advantageous if the recess and the passages to the coil connecting contacts have been formed by means of a milling operation. This is particularly advantageous for a high-precision fabrication of the recess for receiving the module and the passages to the coil connecting contacts.

In a data carrier in accordance with the invention having a recess and having passages to the coil connecting contacts formed in the bottom area of the recess the module connecting contacts, which are connected to the coil connecting contacts in an electrically conductive manner via the passages, can be elastic and can be connected to the coil connecting contacts in an electrically conductive manner exclusively by virtue of their elasticity. However, it has proved to be particularly advantageous if an electrically conductive adhesive has been introduced into the passages, by means of which adhesive the module connecting contacts and the coil connecting contacts are connected to one another in an electrically conductive manner. This results in a particularly reliable electrical connection between the coil connecting contacts and the module connecting contacts.

In a data carrier in accordance with the invention, in which the coil connecting contacts together with the coil turns of the coil are disposed in the winding level zone, it has further proved to be particularly advantageous if the coil turns and the coil connecting contacts of the coil are constituted by conductor tracks formed by means of a screen-printing process. In this way, the advantages of screen-printing processes, whose use for the manufacture of coils for data carriers is known per se, can also be utilized favorably in a data carrier in accordance with the invention.

In the context given above it has further proved to be very advantageous if the coil turns and the coil connecting contacts of the coil are constituted by conductor tracks formed by means of a screen-printing process using a conductive silver paste. This has proved to be particularly favorable in practice.

In a data carrier in accordance with the invention, in which the module carrying a component is mounted in a recess which opens into a body surface of the data carrier body, in which case the first carrier main surface of the carrier of the module, in a customary manner, can be mechanically scanned and is also visible from outside the data carrier, the first carrier main surface of the carrier of the module can be provided with print in order to achieve an optical effect. However, it can also be very advantageous if further module connecting contacts arranged in the area of the first carrier main surface are connected to the carrier of the module and are adapted to cooperate with mating contacts with which they are engageable from outside the data carrier. Thus, it is possible to use a so-called dual-purpose chip as the component in such a data carrier, whose module connecting contacts arranged in the area of the second carrier main surface are connected to the coil connecting contacts of a coil, which has been provided for the contactless data exchange between the dual-purpose chip and a write/read station and, if desired, for the contactless power supply to the dual-purpose chip, and whose further module connecting contacts arranged in the area of the first carrier main surface have been provided for the contact-bound data exchange between the dual-purpose chip and a write/read station and for the contact-bound data exchange between the dual-purpose chip and a write/read station and for the contact-bound power supply to the dual-purpose chip.

Data carriers in accordance with the invention can serve different purposes and can have different shapes, for example, a key shape, a bar shape and other shapes. In this respect it is to be noted that in these forms of data carriers in accordance with the invention said body surface need not necessarily be the body bounding surface have the largest surface area. In the case of a bar shape the body bounding surface referred to as said body surface can be formed by an end face of the bar-shaped data carrier. This also applies to a key-shaped data carrier as well as to data carriers of other shapes. A preferred variant of a data carrier in accordance with the invention is characterized in that the data carrier takes the form of a chip card.

According to the invention a method of the type defined in the second paragraph is characterized in that during the manufacture of the data carrier body the coil turns and the coil connecting contacts are formed on a carrier foil and subsequently the carrier foil, with the coil turns and the coil connecting contacts of the coil formed on it, is stacked with at least one further foil, the coil turns and the coil connecting contacts of the coil then being interposed between the carrier foil and a cover foil, and subsequently the stacked foils are laminated by means of a lamination process in order to form the data carrier body and subsequently the recess is formed in the manufactured data carrier body by means of a material removal process, and in a bottom area of the recess, which bottom area is remote from said body surface, at least two passages, which extend from the bottom area of the recess up to the coil connecting contacts, are formed, preferably also by means of the same material removal process, and the module connecting contacts are connected to the coil connecting contacts through the passages so as to form an electrically conductive connection. Such method has proved to be very favorable for a very low-cost production of a data carrier.

With respect to the material removal in order to form the recess and the passages, it has proved to be particularly advantageous if the material removal for the formation of the recess and the passages to the coil connecting contacts is effected by means of a milling operation. In this way a comparatively large volume of material can be removed very rapidly and very precisely, enabling tolerances of only a few micrometers to be maintained.

In a method in accordance with the invention, in which a recess and passages to the coil connecting contacts formed in the bottom area of the recess are formed in a manufactured data carrier body, it has proved to be particularly advantageous if a test device for testing whether the coil is in good working order is operationally connected to the coil connecting contacts via the recess and the passages before the module is mounted in the recess. This has the advantage that during production of a data carrier the coil connecting contacts can be made accessible from the outside through the recess and the passages, so that a test device can be connected to the coil connecting contacts in an electrically conductive manner in order to test whether a coil incorporated and embedded in a data carrier body is in good working order. The module, which is expensive in comparison with the other data carrier parts, is not mounted in the data carrier body until a positive test result has been obtained. Conversely, in the case of a negative test result, the data carrier body including the defective coil embedded therein but without a module is rejected, so that no module is wasted unnecessarily, which is very advantageous in view of a low-cost production of a data carrier.

For a trouble-free formation of conductive connections between the module connecting contacts and the coil connecting contacts it has proved to be advantageous if an electrically conductive adhesive is introduced into the passages before the module is mounted in the recess. In this way, particularly satisfactory and reliable aging-proof conductive connections are formed between the module connecting contacts and the coil connecting contacts.

It has also proved to be very advantageous if before the module is mounted in the recess a hot-melt adhesive is applied in a peripheral area of the second carrier main surface of the carrier of the module and after the module has been mounted in the recess a heating die of a heating device is placed onto the first carrier main surface of the carrier of the module. This is advantageous for securing the module to the data carrier body by means of its carrier in a simple and reliable manner.

It has also proved to be particularly advantageous if a polycarbonate foil is used as the carrier foil on which the coil turns and the coil connecting contacts of the coil are formed. In practice, such a polycarbonate foil has proved to be particularly advantageous as in the lamination process the coil together with its coil connecting contacts is uniformly pressed into such a foil and, as a result, the coil together with its coil connecting contacts is embedded in the finished data carrier body substantially without any mechanical loads and stresses.

In this respect, it has further proved to be very advantageous if a polyvinyl chloride foil is used as the cover foil which directly adjoins the coil turns and the coil connecting contacts of the coil during stacking of the foils. When such a polyvinyl chloride foil is used as a cover foil this enhances the uniform pressing-in and embedding of the coil.

In this respect, it has also proved to be very advantageous if the coil turns and the coil connecting contacts of the coil are formed by depositing a conductive material on the carrier foil in a screen-printing process. In this way, the advantages of screen-printing processes, the use of which for the fabrication of coils for data carriers is known per se, are also utilized advantageously in a method in accordance with the invention.

In the above context it has further proved to be very advantageous if the coil turns and the coil connecting contacts of the coil are formed by depositing a conductive silver paste on the carrier foil in a screen-printing process. This proves to be particularly advantageous in practice.

The above-mentioned aspects as well as further aspects of the invention will become apparent from the embodiments described hereinafter by way of examples and will be elucidated by means of these embodiments.

BRIEF DESCRIPTION OF THE DRAWINGS

The invention will now be described in more detail with reference to the drawings, which shows two embodiments to which the invention is not limited.

DETAILED DESCRIPTION OF THE PREFERRED EMBODIMENTS

First of all, a possible variant of a method in accordance with the invention for manufacturing a data carrier in accordance with the invention, in the form of a chip card, will be described hereinafter with reference to FIGS. 1 to 8.

Figure 1:
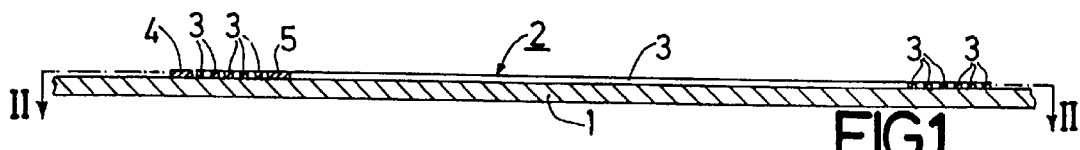
FIG. 1 is a cross-sectional view taken on the line I—I in FIG. 2 and showing a part of a large-area carrier foil which carries a multiplicity of coils, of which only one coil with its coil turns and coil connecting contacts is shown.

In a first process step a large-area carrier foil 1 shown in FIG. 1 is supplied to a screen-printing device. The carrier foil 1 has an area measuring 530 mm×660 mm. The thickness of the carrier foil 1 is approximately 125 $\mu$m. The carrier foil 1 is made of polycarbonate, which has proved to be very advantageous in the method described here.

Figure 2:
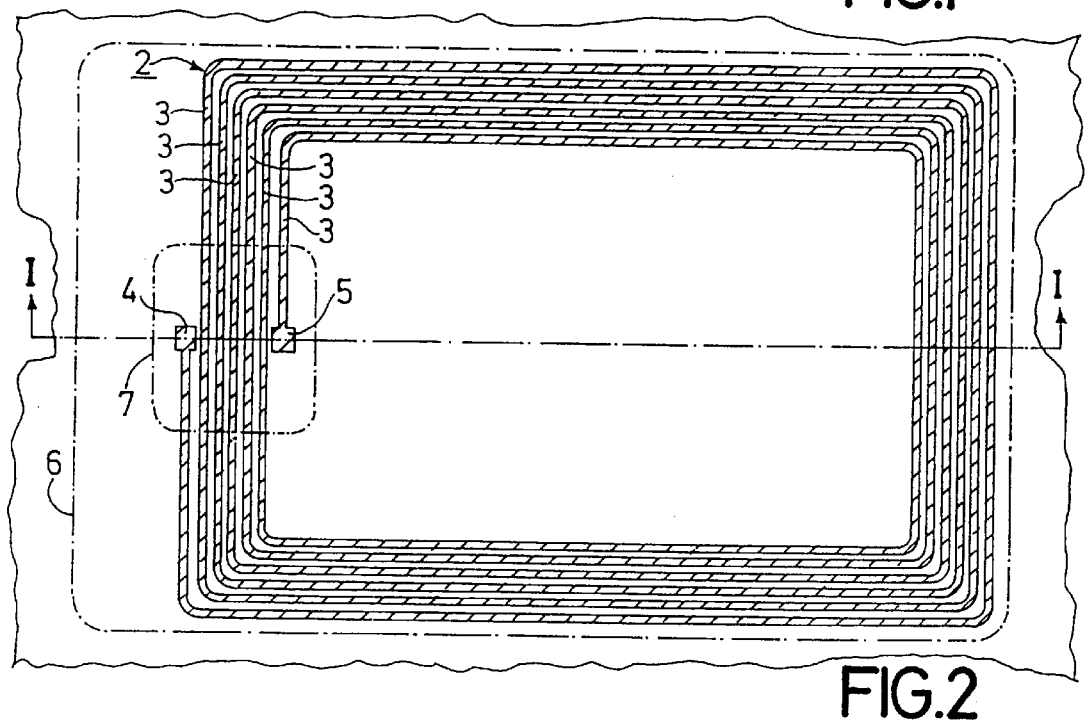
FIG. 2 is a cross-sectional view taken on the line II—II in FIG. 1 and showing a coil with its coil turns and its two coil connecting contacts arranged on the large-area carrier foil.

In a subsequent process step a multiplicity of coils 2 are formed in the screen-printing device by means of a screen-printing technique in that a conductive material, in the present case a conductive silver paste, is applied to the carrier foil, which coils in the present case have a total of six coil turns 3 formed by conductor tracks. It is to be noted that the number and the shape of the coil turns 3 of the coils 2 may also differ. In the present case forty-eight coils are formed on the large-area carrier foil 1 at the same time, of which only one coil 2 is shown in FIGS. 1 and 2. The free end of the outermost coil turn and the free end of the innermost coil turn of each coil 2 has been provided with a rectangular coil connecting contact 4 and 5, respectively. The two coil connecting contacts 4 and 5 are likewise formed by conductor tracks, which are formed on the carrier foil 1 similarly to the coil turns 3. The thickness of the coil turns 3 and of the coil connecting contacts 4 and 5 of the coil 2 is approximately 25 $\mu$m. In order to obtain this thickness by means of a conventional screen-printing technique it is also possible to carry out a plurality of printing cycles, in each of which subsequent printing cycle conductive silver paste is deposited on the conductive silver paste applied in the preceding printing cycle, so that the desired thickness of the coil turns 3 and the two coil connecting contacts 4 and 5 of the coil 3 can be obtained by successively depositing layers of conductive silver paste onto one another in a screen-printing process.

The above formation of the coils 2 on the carrier foil 1 yields the intermediate product shown in FIGS. 1 and 2.

With respect to FIG. 2, it is to be noted that in this Figure the outline of a chip card to be manufactured is shown by means of a dash-dot line 6 and the outline of a carrier of a module including a component in the form of a chip is shown by means of a further dash-dot line 7.

Figure 3:
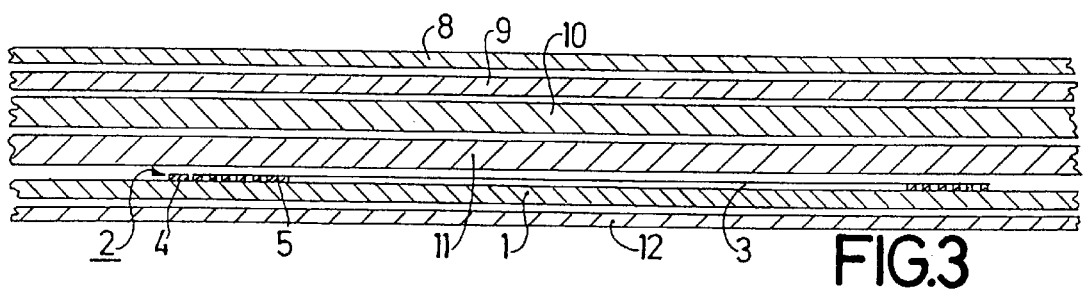
FIG. 3, in a manner similar to FIG. 1, shows a foil stack comprising a total of six large-area foil and including the large-area foil shown in FIG. 1.

In the next process step—as is shown diagrammatically in FIG. 3—the large-area carrier foil 1 with the coils 2 formed on it is stacked together with, in the present case, five further foils 8, 9, 10, 11 and 12 in total, the coils 2 and, consequently, its coil connecting contacts 4 and 5 thus being interposed between the carrier foil 1 and a cover foil 11. With respect to the cover foil 11 it is to be noted that this is a polyvinyl chloride foil having a thickness of approximately 200 $\mu$m. The nominal areas of the further foils 8, 9, 10, 11 and 12 correspond to the area of the carrier foil 1.

As regards the foil 12 at the side of the surface of the carrier foil 1 which is remote from the coils 2, it is to be noted that this is also a polyvinyl chloride foil but that it has a thickness of only approximately 100 $\mu$m. In the same way as the foil 12, the foil 8 is also made of polyvinyl chloride and, similarly to the foil 12, it also has a thickness of approximately 100 $\mu$m. In the same way as the carrier foil 1, the foil 9 is also made of polycarbonate and, similarly to the foil 1, it also has a thickness of approximately 125 $\mu$m. In the same way as the foil 11, the foil 10 also consist of polyvinyl chloride and, similarly to the foil 11, it also has a thickness of approximately 200 $\mu$m.

Figure 4:
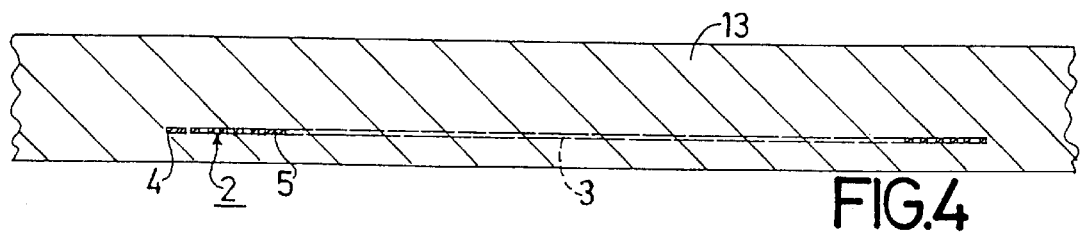
FIG. 4, in a manner similar to FIGS. 1 and 3, shows a large-area foil body obtained by lamination of the foil stack shown in FIG. 3, in which foil body a multiplicity of coils including their coil connecting contacts have been embedded.

After the foils 8, 9, 10, 11, 1 and 12 have been stacked, as can be see in FIG. 3, the stacked foils are laminated in a lamination process during a subsequent process step. In this lamination process the foils 8, 9, 10, 11, 1 and 12 are bonded to one another under the influence of pressure and heat, the individual foils being fused to one another in a controlled manner by a so-called foil homogenization, yielding a large-area foil body 13, as is shown in FIG. 4. In the large-area foil body 13, whose area measures 530 mm×660 mm, a plurality of coils 2 have been embedded, as is shown for a coil 2 in FIG. 4.

Figure 5:
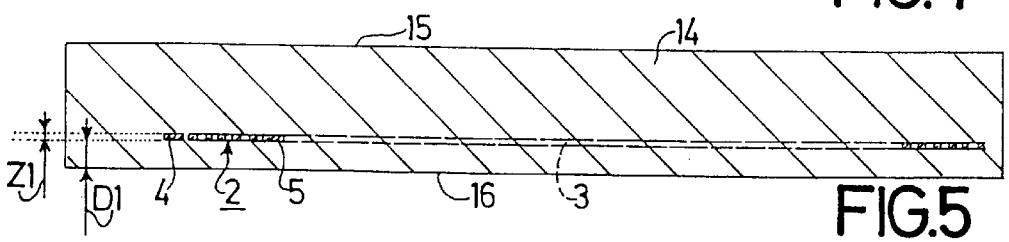
FIG. 5, in a manner similar to FIGS. 1, 3 and 4, shows a card body of a chip card punched out of the foil body shown in FIG. 4, in which card body a coil together with its two coil connecting contacts has been embedded.

In a subsequent process step a plurality of card bodies 14, to be regarded as data carrier bodies, are punched out of the large-area foil body 13 by means of a punching die in a punching operation. In the present case forty-eight card bodies 14 in total are punched from one foil body, of which one card body is shown in FIG. 5. The card body 14 shown in FIG. 5 is punched out of the large-area foil body 13 along the dash-dot line referenced 6 in FIG. 2.

The card body 14 is bounded by a first body main surface 15 and by a second body main surface 16 parallel to the first body main surface 15. The coil 2 is embedded in the card body 14, the coil turns 3 of the coil 2 as well as the two coil connecting contacts 4 and 5 of the coil 2 in the present case being incorporated in the card body 14 so as to extend parallel to the two body main surfaces 15 and 16 and being disposed in a winding level zone Z1 of the card body 14, which winding level zone extends transversely, in the present case perpendicularly, to the first body main surface 15 and, in the present case, also to the second body main surface 16. In the present case, the winding level zone Z1 in which the coil 2 is disposed is spaced at a distance D1 from the second body main surface 16. The distance D1 has a value of approximately 200 $\mu$m.

Figure 6:
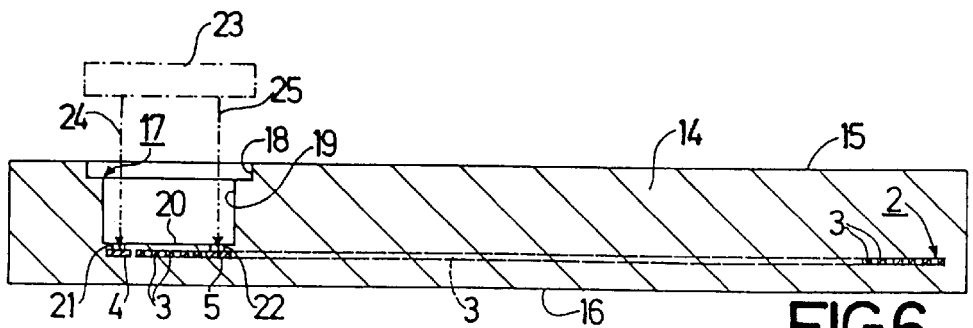
FIG. 6 in a manner similar to FIGS. 1, 3, 4 and 5, shows the card body of FIG. 5, which has a recess and two passages which extend from the recesses up to the two coil connecting contacts.

In a subsequent process step a recess 17, as can be seen in FIG. 6, is formed in the manufactured card body 14 by removing material by means of a milling cutter in a milling operation. During said milling operation two milling steps are carried out, as a result of which a recess 17 is formed having a cross-sectionally larger first recess portion 18 and a cross-sectionally smaller second recess portion 19. The recess 17—as is apparent from FIG. 6—opens into the first body main surface 15.

In the bottom area, which is remote from the first body main surface 15, i.e. in the area of a bottom surface 20 of the recess 17, two passages are formed which extend from the recess 17 up to the coil connecting contacts 4 and 5. The two passages 21 and 22 are made in a third milling step and in a fourth milling step of said milling operation.

In a following process step a test device 23, shown diagrammatically by means of a dash-dot line in FIG. 6, for testing whether the coil 2 is in good working order, is brought into operational contact with the two coil connecting contacts 4 and 5 of the coil 2 via the recess 17 and the two passages 21 and 22. This is effected in that two test contacts 24 and 25 of the test device 23 are brought into conductive contact with the two coil connecting contacts 4 and 5. By means of the test device 23 it is possible to determine whether the coil 2 is in good working order. When the test device 23 detects a defective or faulty coil 2 the relevant card body 14 together with the defective coil 2 embedded therein is rejected. When the test device 23 detects that the coil 2 is in good working order, the relevant card body 14 together with the coil 2 embedded therein is subsequently used for the fabrication of a chip card.

Figure 7:
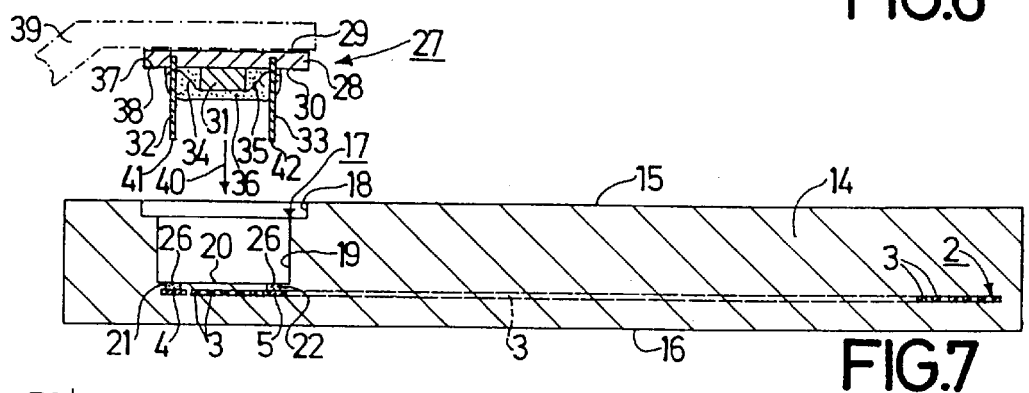
FIG. 7, in a manner similarly to FIGS. 1, 3, 4, 5 and 6, shows the card body of FIG. 6, in which an electrically conductive adhesive has been introduced into the passages and a module is situated above the recess in the card body.

In a further process step an electrically conductive adhesive 26 in introduced into the two passages 21 and 22 by means of a dispenser device, as is shown in FIG. 7.

Already before the electrically conductive adhesive 26 is introduced into the two passages 21 and 22 a so-called module is processed in the method described here. Such a module 27 is shown diagrammatically in FIG. 7.

The module 27 comprises a plate-shaped carrier 28. The carrier 28 is bounded by a first carrier main surface 29 and by a second carrier main surface 30, which extends parallel to the first carrier main surface 29. The surface area of the carrier 28 substantially correspond to the cross-sectional dimensions of the first recess portion 18, i.e. they are only slightly smaller. The outlines of the first recess portion 18 and of the carrier 28 correspond to the shape of that indicated by means of the dash-dot line 7 in FIG. 2.

The module 27 further comprises a component in the form of a chip 31, which in known manner is formed by an integrated device. The chip 31 is attached to the carrier 28, i.e. to the second carrier main surface 30 of the carrier 28, for example by means of an adhesive joint. As is apparent from FIG. 7, the chip 31 is thus raised with respect to the second carrier main surface 30.

The module 27 further comprises two module connecting contacts 32 and 33 situated in the area of the second carrier main surface 30 and adapted to cooperate with the two coil connecting contacts 4 and 5. Here, the two module connecting contacts 32 and 33 are pin-shaped and are mounted in the carrier 28, from whose second carrier main surface 30 the two pin-shaped module connecting contacts 32 and 33 project perpendicularly in the present case. The two module connecting contacts 32 and 33—which is shown only diagrammatically in FIG. 7—are connected in an electrically conductive manner to chip connecting contacts of the chip 31 via a so-termed bonding wire 34 and 35 each, which connecting contacts are not shown in FIG. 7 and are generally referred to as pads among experts. In reality the pin-shaped module connecting contacts 32 and 33 are electrically connected to two conductor tracks, not shown, which are arranged on the carrier 28 in the area of the second carrier main surface 30 of the carrier 28, each of the two bonding wires 34 and 35 being electrically connected to one of these two conductor tracks.

It is to be noted that the chip 31 and the two bonding wires 34 and 35 as well as one of the two module connecting contacts 32 and 33 are embedded in a package 36 formed by a synthetic-resin encapsulant.

As is apparent from FIG. 7, the two module connecting contacts 32 and 33 in the present module 27 are of a special construction, i.e. such that the module connecting contacts 32 and 33 adapted to cooperate with the two coil connecting contacts 4 and 5 extend beyond the level of the chip 31 and, in the present case also the package 36, in a direction perpendicular to and away from the second carrier main surface 30.

A module 27 as described hereinbefore is, for example, supplied in large quantities by a manufacturer of such modules, said modules being supplied, for example, in tape form.

In the course of the process described here a hot-melt adhesive 38 is applied in a peripheral area 37 of the second carrier main surface 30 of the carrier 28 during a further process step, as is indicated in FIG. 7.

Figure 8:
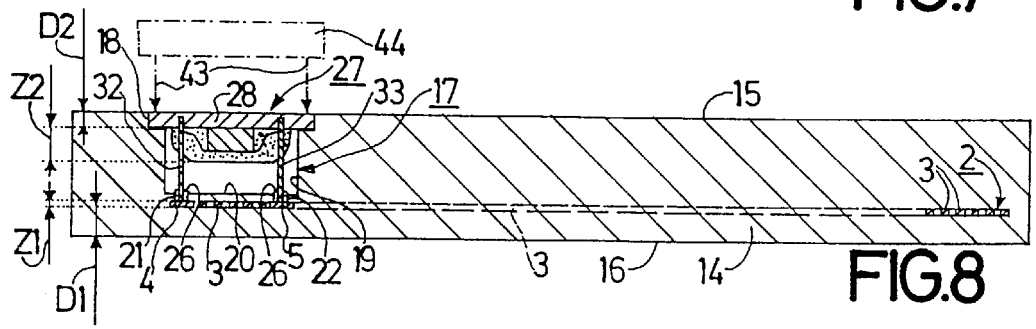
FIG. 8, in a manner similar to FIGS. 1, 3, 4, 5, 6 and 7, shows a finished chip card as a data carrier in accordance with a first embodiment of the invention, a module being accommodated in the recess of its card body.
Figure 9:
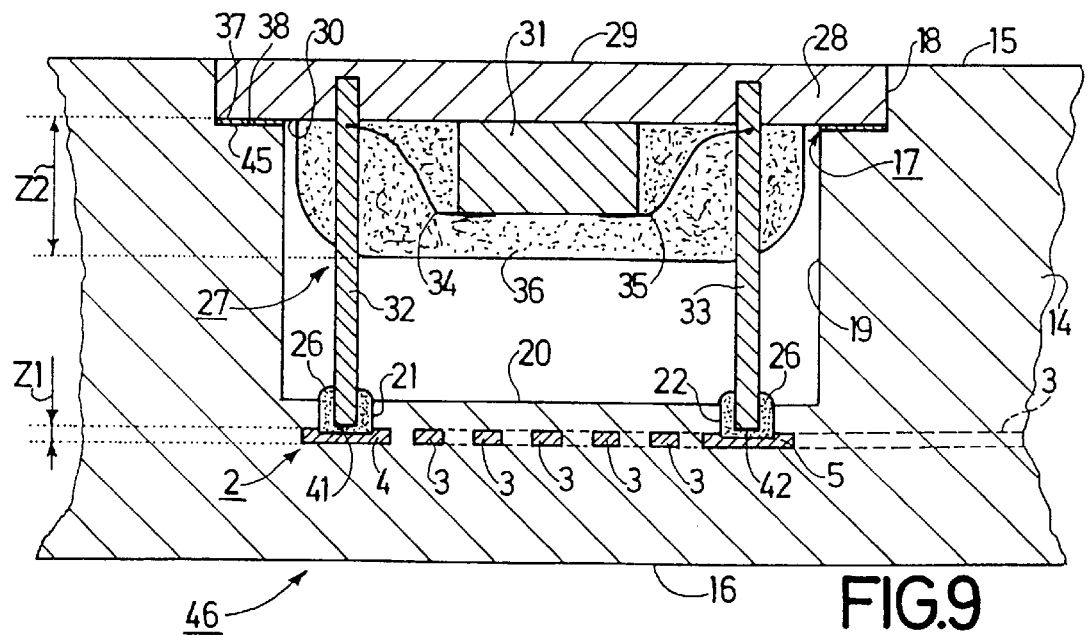
FIG. 9, in the same way as FIG. 8, shows the finished chip card with the module mounted in the recess, the card being shown only partly and to a scale four times as large as that of FIG. 8, the two module connecting contacts and the two coil connecting contacts being connected to one another in an electrically conductive manner by means of an electrically conductive adhesive.

Subsequently, in a further process step the module 27 is placed in the recess 17 by means of a bonding arm 39, shown diagrammatically in dash-dot lines in FIG. 7, with the chip 31 and the two module connecting contacts 32 and 33 facing forward in the direction indicated by the arrow 40. Towards the end of this placement operation the free end portions 41 and 42 of the two pin-shaped module connecting contacts 32 and 33 engage the two passages 21 and 22 filled with the electrically conductive adhesive 26. Depending on the prevailing tolerances the free ends 41 and 42 of the two module connecting contacts 32 and 33 may even penetrate so far that they directly adjoin the two coil connecting contacts 4 and 5. However, as a rule a small clearance will remain between the free ends 41 and 42 of the module connecting contacts 32 and 33 and the coil connecting contacts 4 and 5, as is shown in FIG. 9. When the free end portions 41 and 42 of the module connecting contacts 32 and 33 penetrate the passages 21 and 22 the electrically conductive adhesive 26 is partly urged out of the passages 21 and 22, as is shown in FIGS. 8 and 9. After the module 27 has been placed into the recess 17 of the card body 14 the process situation illustrated in FIG. 8 is obtained.

In a further process step a heating die 43, represented diagrammatically by means of two arrows in FIG. 8, which die forms part of a heating device 44, represented diagrammatically in dash-dot lines in FIG. 8, is placed onto the first carrier main surface 29 of the carrier 28 in order to activate the hot-melt adhesive 38. Subsequently, heat is transferred from the applied heating die 43 to the hot-melt adhesive via the carrier 28, after which the heating die 43 is lifted off the carrier 43. During the subsequent cooling an adhesive joint is formed between the peripheral area 37 of the carrier 28 and the annular bounding surface 45 of the recess 17, which surface extends parallel to the two body main surfaces 15 and 16, said adhesive joint thus securing the module 27 to the card body 14. To secure the module 27 to the card body 14 it is also possible to use an adhesive as employed in the so-called cold bonding technique.

Upon completion of the last-mentioned process step a finished chip card 46 forming a data carrier in accordance with a first embodiment of the invention is obtained. This chip card 46 is shown partly in FIG. 9.

Upon mounting of the module 27 in the recess 17 of the card body 14 the first carrier main surface 29 of the carrier 28 lies against the first body main surface 15 of the card body 14 and, in the present case, the first carrier main surface 29 is then flush with the first body main surface 15. Furthermore, the second carrier main surface 30 of the carrier 28 is then remote from the first body main surface 15 of the card body 14 and faces the second body main surface 16 of the card body 14. Moreover, the chip 31 forming the component is then situated in a component level zone Z2 of the card body 14, which component level zone extends transversely, in the present case perpendicularly, to the first body main surface 15 and, in the present case, also perpendicularly to the second body main surface 16 of the card body 14. In this case the component level zone Z2 is spaced at a distance D2 from the first body main surface 15. The distance e D2 now has a value of approximately 100 $\mu$m. In the present case, in which the chip 31 is embedded in a package 36, the component level zone Z2 of the card body 14 extends over the entire height dimension of the package 36. In the case that a module is used in which the chip forming the component does not have a package, or in which the package is substantially flush with the chip, it is adequate if the component level zone Z2 extends only up to the end level zone of the chip, which area is remote from the second carrier main surface of the carrier.

As is apparent from FIG. 9, the data carrier 46 has advantageously been constructed in such a manner that the coil turns 3 of the coil 2 and, in the present case also the two coil connecting contacts 4 and 5 of the coil 2, are disposed in a winding level zone Z1 situated outside the component level zone Z2 and that the two module connecting contacts 32 and 33 extend up to the two coil connecting contacts 4 and 5b through the component level zone Z2 and, in the present case, also beyond the component level zone Z2. This construction has the advantage that—although the chip 31 and its package 36 project from the same carrier main surface, i.e. the second carrier main surface 30 of the carrier 28 of the module 27—the presence of the chip 31 does not impose any restrictions on the arrangement of the coil turns 3 of the coil 2 and the construction of the coil 2 in the proximity of the chip 31 forming the component because the chip 31 together with its package 36 is disposed in an completely other level zone than the coil turns 3 of the coil 2 and the two coil connecting contacts 4 and 5 of the coil 2. As is also apparent from FIG. 9, the fact that the two module connecting contacts 32 and 33 extend up to the two coil connecting contacts 4 and 5 does not mean that the module connecting contacts 32 and 33 and the coil connecting contacts 4 and 5 are directly in contact with one another. In the data carrier 46, as is shown in FIG. 9, the mechanical connection between the module connecting contacts 32, 33 and the coil connecting contacts 4, 5 as well as the electrical connection between these contacts are made by means of the electrically conductive adhesive 26, which guarantees a reliable and aging-proof connection between the module connecting contacts 32, 33 and the coil connecting contacts 4, 5. As is also apparent from FIG. 9, the two coil connecting contacts 4 and 5 have been slightly milled off during milling of the two passages 21 and 22, but this does not give rise to any adverse effects. The two coil connecting contacts 4 and 5 may even be perforated completely during the milling operation without any undesired effect on the electrically conductive connection between the module connecting contacts 32, 33 and the coil connecting contacts 4, 5, because the electrically conductive adhesive 26 completely fills up the perforations in the two coil connecting contacts 4 and 5 and thereby also establishes a proper electrical connection between the module connecting contacts 32, 33 and the coil connecting contacts 4, 5.

Figure 10:
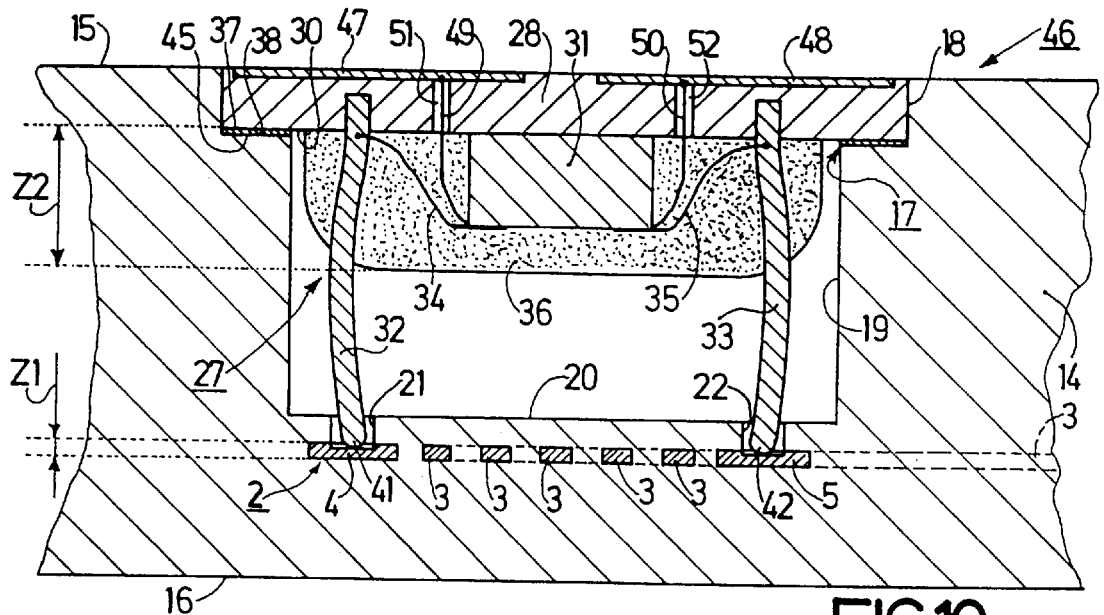
FIGS. 10 and 11, in a manner similar to FIG. 9, shows a finished chip card as a data carrier in accordance with a second embodiment of the invention, which chip card also comprises a laminated card body and has two module connecting contacts which are elastically resilient and which are connected to one another in an electrically conductive manner exclusively by virtue of their elasticity.
Figure 11:
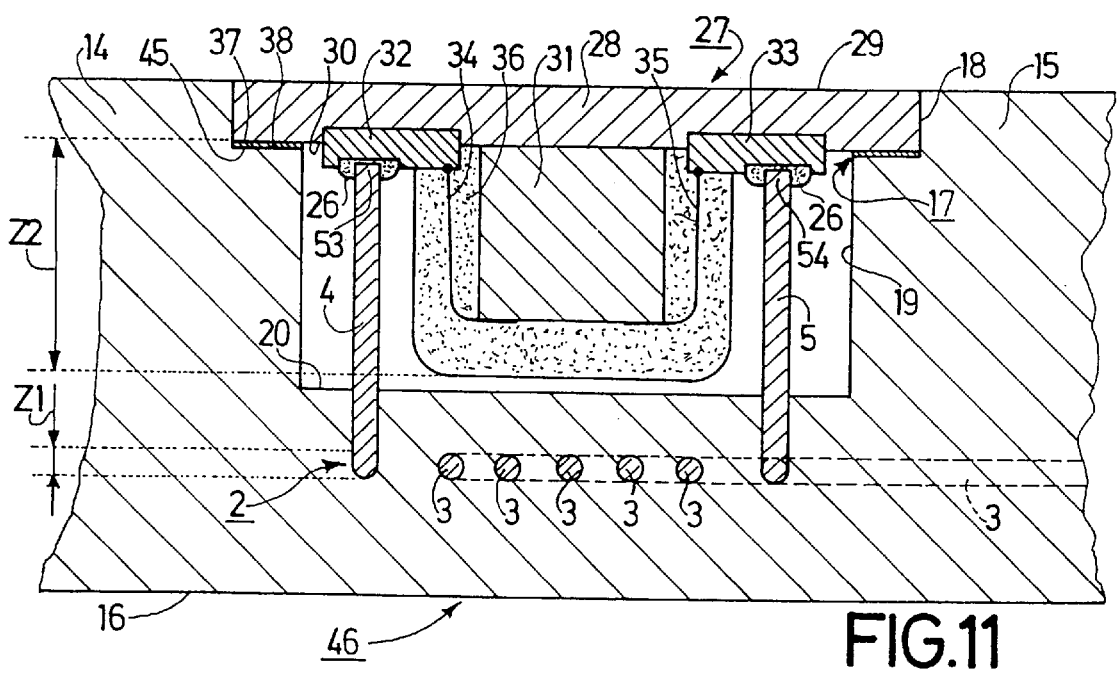

FIG. 10 shows a chip card 46 forming a data carrier in accordance with a second embodiment of the invention. In this chip card 46 the module 27 has two elastically resilient module connecting contacts 32 and 33, whose nominal length has been selected in such a manner that in the finished condition of the data carrier 46 shown in FIG. 10 the two module connecting contacts 32 and 33 are bent by virtue of their elasticity and thus form an electrically conductive connection to the two coil connecting contacts 4 and 5 of the coil 2 exclusively by virtue of their elasticity, so that no electrically conductive adhesive for connecting the module connecting contacts 32, 33 and the coil connecting contacts 4, 5 is required and can thus be saved.

In the chip card 46 as shown in FIG. 10 further module connecting contacts arranged in the area of the first carrier main surface 29 are connected to the carrier 28 of the module 27 and are adapted to cooperate with mating contacts with which they are engageable from outside the chip card 46. The chip card 46 of FIG. 10 has eight of such further module connecting contacts in total, only two of said further module connecting contacts 47 and 48 being shown in FIG. 10. As is shown for the two further module connecting contacts 47 and 48 in FIG. 10, the further module connecting contacts are connected to further chip connecting contacts (pads), not shown, of the chip 31 via further bonding wires, two of said further bonding wires 49 and 50 being shown in FIG. 10. The further bonding wires are passed through bores formed in the carrier 28, two of said bores 51 and 52 being shown in FIG. 10.

The chip 31 forming the component of the chip card 46 in FIG. 10 is a so-termed dual-purpose chip whose module connecting contacts 32 and 33 arranged in the area of the second carrier main surface 30 are connected to the coil connecting contacts 4 and 5 of the coil 2 provided for the contactless data exchange between the dual-purpose chip and a write/read station and, optionally, for the contactless transmission of power to the dual-purpose chip, and whose further module connecting contacts arranged in the area of the first carrier main surface 29 are adapted to provide the contact-bound data exchange between the dual-purpose chip and a write/read station for the contact-bound transmission of power to the dual-purpose chip.

In the chip card 46 as shown in FIG. 10 the component formed by the chip 31 including its package 36 and the coil 2 with its coil turns 3 and its two coil connecting contacts 4 and 5 are disposed in different level zones, i.e. the component formed by the chip 31 including its package 36 is disposed in the component level zone Z2 and the coil 2 is disposed in the winding level zone Z1, which in the chip card 46 of FIG. 10 also yields the great advantage that—although the chip 31 and its package 36 and the two module connecting contacts 32 and 33 project from the same carrier main surface, i.e. the second carrier main surface 30 of the carrier 28 of the module 27—the presence of the chip 31 does not impose any restrictions on the arrangement of the coil turns 3 of the coil 2 and the construction of the coil 2 in the proximity of the chip 31.

The invention is not limited to the embodiments described hereinbefore by way of examples. For example, for making a recess in the data carrier body it is also possible to use other suitable techniques, for example etching techniques or laser techniques. Other suitable techniques are also available for manufacturing the coils, for example etching techniques. Moreover, two or more than two coils mat be incorporated in a data carrier body. A module mounted in a data carrier need not necessarily a component in the form of a chip, but the component may alternatively be a capacitor, a pressure-sensitive film switch, or the like. Furthermore, it is to be noted that the component in a chip card forming a data carrier in accordance with the invention need not necessarily comprise a single chip but it may alternatively comprise two or more chips. A chip card may, for example, also include two modules each comprising one chip or, alternatively, one module comprising two chips. In the embodiments described hereinbefore the module carriers are accessible at the location of the first body main surface of the card body, the first carrier main surface and the first body main surface in the chip cards in accordance with the two embodiments described above being flush; however, it is possible to have a chip card in which the first carrier main surface of the carrier of a module is covered with a cover layer, the outer bounding surface of this cover layer then being flush with the first body main surface of the card body of this chip card. In the embodiments described above each time one module connecting contact and one coil connecting contact are disposed opposite one another in a direction exactly perpendicular to the body main surfaces and exactly perpendicular to the carrier main surfaces; however, this is not necessary, but a module connecting contact and a coil connecting contact may also be disposed opposite one another in a direction which is inclined with respect to the body main surfaces and the carrier main surfaces, in which case the module connecting contact which extends through the component level zone of the chip card is inclined with respect to the afore-mentioned main surfaces.

Finally, an essential fact to be noted is that in all the embodiments of data carriers described within the scope of the present Application said body surface which bounds the data carrier body and in which the recess in which the module is mounted terminates is an externally accessible outer body surface. However, this need not be so because after the module has been mounted in data carriers in accordance with the described embodiments, in the case that this module is exclusively intended for contactless operation in a data carrier, said body surface may be provided with a cover layer, for example in the form of a cover foil, which can wholly cover the module and, in the case of a module intended for contact-bound operation in a data carrier, it may cover the module in such a manner that at least the further module connecting contacts remain exposed to allow cooperation with contact pins of a read/write device, or it may not at all cover such a module but merely said body surface. In the case of a such a construction the outer body surface of the data carrier body of a data carrier is formed by the outer surface of the cover layer.

I claim:

1. A data carrier comprising a data carrier body bounded by a body surface and incorporating a module and a coil, which coil is separate from the module and has coil turns and at least two coil connecting contacts, the module comprising a plate-shaped carrier, which extends substantially parallel to said body surface and which is bounded by a first carrier main surface facing said body surface and by a second carrier main surface substantially parallel to the first carrier main surface, and at least one component, which component is incorporated in the data carrier body, is connected to the carrier, is raised with respect to the second carrier main surface, and is disposed in a component level zone which extends transversely to said body surface, and at least two module connecting contacts connected to the carrier and arranged in the area of the second carrier main surface, and the coil turns of the coil, at least in their area adjacent the component, being disposed in a winding level zone which is situated outside the component level zone and which extends transversely to said body surface, the coil connecting contacts together with the coil turns being disposed in the winding level zone, and each coil connecting contact being disposed opposite a module connecting contact in a direction transverse to the second carrier main surface and being connected to the last-mentioned connecting contact in an electrically conductive manner, and the module connecting contacts projecting beyond the level of the component and extending through the component level zone up to the coil connecting contacts, which are disposed in the winding level zone, and the data carrier having a recess which terminates in said body surface and which accommodates the module, characterized in that the data carrier body has been manufactured from at least two foils by means of a lamination process, and there has been provided a recess formed by means of a material removal process, and in a bottom area of the recess, which bottom area is remote from said body surface, at least two passages, which extend from the bottom area of the recess up to the coil connecting contacts, have been formed, preferably also by means of the same material removal process, through which passages the module connecting contacts are connected to the coil connecting contacts in an electrically conductive manner.

2. A data carrier as claimed in claim 1, characterized in that the recess and the passages to the coil connecting contacts have been formed by means of a milling operation.

3. A data carrier as claimed in claim 1, characterized in that an electrically conductive adhesive has been introduced into the passages, by means of which adhesive the module connecting contacts and the coil connecting contacts are connected to one another in an electrically conductive manner.

4. A data carrier as claimed in claim 1, characterized in that the coil turns and the coil connecting contacts of the coil are constituted by conductor tracks formed by means of a screen-printing process.

5. A data carrier as claimed in claim 4, characterized in that the coil turns and the coil connecting contacts of the coil are constituted by conductor tracks formed by means of a screen-printing process using a conductive silver paste.

6. A data carrier as claimed in claim 1, characterized in that further module connecting contacts arranged in the area of the first carrier main surface are connected to the carrier of the module and are adapted to cooperate with mating contacts with which they are engageable from outside the data carrier.

7. A data carrier as claimed in claim 1, characterized in that the data carrier is constructed as a chip card.

8. A method of manufacturing a data carrier, in which a data carrier body is manufactured, which data carrier body is bounded by a body surface and in which during the manufacture of the data carrier body a coil having coil turns and at least two coil connecting contacts is incorporated in the data carrier body, which coil turns, at least in their area adjacent a component after the method has been completed, are arranged in a winding level zone which is situated outside a component level zone of the component and extends transversely to said body surface, and the coil connecting contacts together with the coil turns are arranged in the winding level zone, and in which a module is incorporated in the data carrier body, which module comprises a plate-shaped carrier, which is bounded by a first carrier main surface and by a second carrier main surface substantially parallel to the first carrier main surface, and the component, which is connected to the carrier and is raised with respect to the second carrier main surface, and at least two module connecting contacts connected to the carrier and arranged in the area of the second carrier main surface, the first carrier main surface then facing said body surface and the second carrier main surface being remote from said body surface and the component then being disposed in its component level zone which extends transversely to said body surface, and each module connecting contact and each coil connecting contact then being disposed opposite one another in a direction transverse to the second carrier main surface and being connected in an electrically conductive manner, and in which for incorporation in the data carrier body a module is used whose module connecting contacts project beyond the level of the component of the module, and the module connecting contacts are passed through the component level zone up to the coil connecting contacts, which are disposed in the winding level zone, and are connected to the coil connecting contacts so as to form an electrically conductive connection, and in which a recess which terminates in said body surface is formed in the data carrier body, characterized in that during the manufacture of the data carrier body the coil turns and the coil connecting contacts are formed on a carrier foil and subsequently the carrier foil, with the coil turns and the coil connecting contacts of the coil formed on it, is stacked with at least one further foil, the coil turns and the coil connecting contacts of the coil then being interposed between the carrier foil and a cover foil, and subsequently the stacked foils are laminated by means of a lamination process in order to form the data carrier body and subsequently the recess is formed in the manufactured data carrier body by means of a material removal process, and in a bottom area of the recess, which bottom area is remote from said body surface, at least two passages, which extend from the bottom area of the recess up to the coil connecting contacts, are formed, preferably also by means of the same material removal process, and the module connecting contacts are connected to the coil connecting contacts through the passages so as to form an electrically conductive connection.

9. A method as claimed in claim 8, characterized in that the material removal for the formation of the recess and the passages to the coil connecting contacts is effected by means of a milling operation.

10. A method as claimed in claim 8, characterized in that a test device for testing whether the coil is in good working order is operationally connected to the coil connecting contacts via the recess and the passages before the module is mounted in the recess.

11. A method as claimed in claim 8, characterized in that an electrically conductive adhesive is introduced into the passages before the module is mounted in the recess.

12. A method as claimed in claim 8, characterized in that before the module is mounted in the recess a hot-melt adhesive is applied in a peripheral area of the second carrier main surface of the carrier of the module and after the module has been mounted in the recess a heating die of a heating device is placed onto the first carrier main surface of the carrier of the module.

13. A method as claimed in claim 8, characterized in that a polycarbonate foil is used as the carrier foil on which the coil turns and the coil connecting contacts of the coil are formed.

14. A method as claimed in claim 8, characterized in that a polyvinyl chloride foil is used as the cover foil which directly adjoins the coil turns and the coil connecting contacts of the coil during stacking of the foils.

15. A method as claimed in claim 8, characterized in that the coil turns and the coil connecting contacts of the coil are formed by depositing a conductive material on the carrier foil in a screen-printing process.

16. A method as claimed in claim 15, characterized in that the coil turns and the coil connecting contacts of the coil are formed by depositing a conductive silver paste on the carrier foil in a screen-printing process.

* * * * *